United States Patent
Morris

(10) Patent No.: US 6,229,608 B1
(45) Date of Patent: *May 8, 2001

(54) PROCEDURE AND SYSTEM FOR INSPECTING A COMPONENT WITH LEADS TO DETERMINE ITS FITNESS FOR ASSEMBLY

(75) Inventor: Joseph Morris, Cheshire (GB)

(73) Assignee: PMJ automec Oyj, Virkkala (FI)

( * ) Notice: Subject to any disclaimer, the term of this patent is extended or adjusted under 35 U.S.C. 154(b) by 0 days.

This patent is subject to a terminal disclaimer.

(21) Appl. No.: 09/329,542

(22) Filed: Jun. 10, 1999

(51) Int. Cl.$^7$ .................................................. G01B 11/14
(52) U.S. Cl. ..................... 356/375; 250/599.26; 356/394
(58) Field of Search .................................... 356/375, 376, 356/400, 381, 372, 384, 385; 250/599.26

(56) References Cited

U.S. PATENT DOCUMENTS

| | | | |
|---|---|---|---|
| 4,745,295 | * 5/1988 | Seno et al. | 356/381 |
| 5,278,634 | * 1/1994 | Skunes et al. | 356/400 |
| 5,309,223 | * 5/1994 | Konicek et al. | 356/375 |
| 5,559,727 | * 9/1996 | Deley et al. | 356/375 |
| 5,805,722 | 9/1998 | Cullen et al. | 382/146 |
| 5,956,149 | * 9/1999 | Suzuki et al. | 356/375 |

OTHER PUBLICATIONS

Cognex SMD Placement Guidance Package; "Placement Guidance Machine Vision Software Package for SMDs", 1996.

"How to get the results you need from machine vision" David Clark; Vision Systems, Reprinted from KCS, Aug. 1996.

* cited by examiner

Primary Examiner—Hoa Q. Pham
Assistant Examiner—Sang H. Nguyen
(74) Attorney, Agent, or Firm—Altera Law Group, LLC

(57) ABSTRACT

Procedure and system for inspecting a component (1) with leads to determine its fitness for assembly before the component is placed on a circuit board. A narrow illuminating beam (10) is directed from a light source (9) at a light-sensitive detector (11). The component (1) is moved in relation to the illuminating beam so that at least one of the leads (4) of the component passes through the illuminating beam and so that the position of the gripper (7) holding the component as a function of time is known. The position data of the gripper is registered. The signal produced by the light-sensitive detector as a result of the illuminating beam being intercepted and shadowed by the lead is registered. Based on the position data of the gripper and the signal produced by the light-sensitive detector position coordinates of a specified lead in relation to the gripper are determined in order to determine the position error, and, if a position error occurs, the position coordinates of said lead of the component are corrected to eliminate said error for making the insertion of the component possible.

31 Claims, 11 Drawing Sheets

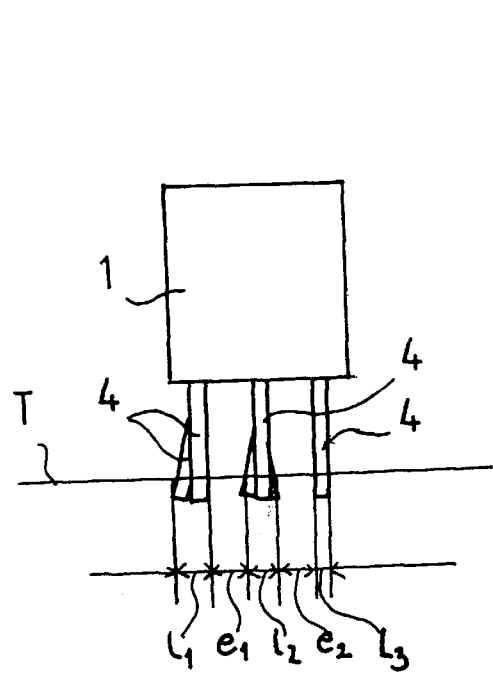
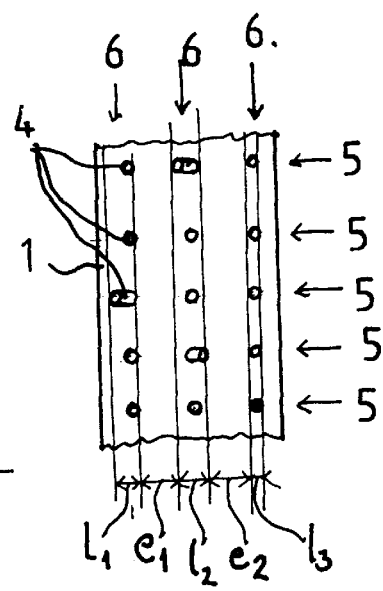
Fig 8       Fig 9
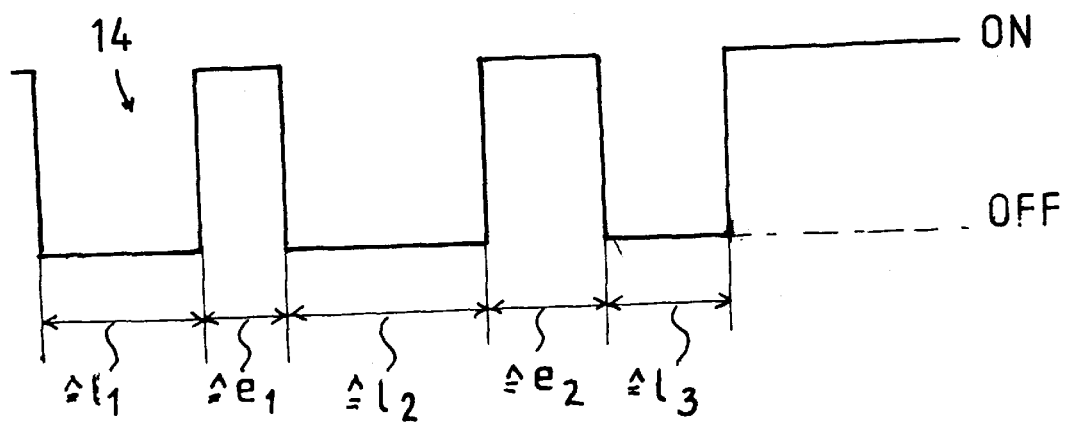
Fig 10

PROCEDURE AND SYSTEM FOR INSPECTING A COMPONENT WITH LEADS TO DETERMINE ITS FITNESS FOR ASSEMBLY

FIELD OF THE INVENTION

The present invention relates to a procedure and system for inspecting a component with leads to determine its fitness for assembly in conjunction with automatic circuit board assembly performed using an assembly robot before the component is placed on a circuit board, said component having at least two leads to be inserted into corresponding holes in the circuit board, said robot being equipped with a gripper for taking hold of the component.

BACKGROUND OF THE INVENTION

For automatic placement of components on a circuit board, usually an assembly robot is used in a computer-controlled assembly robot cell provided with a circuit board conveyor, which brings the circuit board to an assembly station located within the working area of the robot. The assembly robot is preferably a xyzw-robot (also called as a xyzrz-robot) which refers to a robot having four degrees of freedom (x, y, z, w). The robot is provided with grippers for taking hold of a component. The robot is capable of three-dimensional motion in x, y and z directions which form the three degrees of freedom and the rotation of the grippers about z-axis forms the fourth degree of freedom (w or rz). The robot is e.g. a portal robot working in the space above the circuit board conveyor. It fetches one component at a time from a component feed device and places it in a specified location on the circuit board. Before being placed on the circuit board, the component must be inspected to determine whether it is fit for assembly. Because the gripper may grip the component inaccurately, it is important to check the position error of the component in relation to the gripper so that a proper insertion can be made.

The leads of the component must also be aligned in a sufficiently straight line and they must not have too much sideways bends because in that case they would not go through the holes in the circuit board.

In prior art, vision procedures and systems based on machine vision for inspecting electronic components to determine their fitness for assembly are known. This type of systems based on machine vision are manufactured e.g. by the American companies Adept Technology Inc. (San Jose, U.S.A.) and Cognex Corporation (Massachusetts, U.S.A.).

A prior-art system comprises an upward directed camera disposed at a fixed location beside a circuit board conveyor. A robot first takes each component, with the leads pointing downward, onto the optics of the camera, which takes a picture of the tips of the leads from below, whereupon a vision program comprised in the system computes the positions of the leads on the basis of the image and compares them with approved reference values. If the vision software finds a position error of the component in relation to the gripper the error is corrected by the software. Also if the detected lead positions are not within acceptable tolerances, i.e. one or more leads have been bent, then the software instructs the robot to reject the component and get a new one for inspection and assembly.

A problem with this prior-art procedure and system is that it is very expensive as it incorporates many components: a camera, lighting, a machine vision processor with software to develop applications, a video monitor to display images, user interface etc.

A further problem is that there are may factors impairing the reliability of machine vision. The image may be blurred due to reflections, and the contrast between the component body and the leads may be poor. Also, the colour of the component body visible on the background of the leads may cause blurring of the image. The leads may not be distinct enough from the background. In order to be able to distinguish the leads from the background of the component bodies of different colours one would need to arrange different kind of illuminations specific for each colour.

In principle, this problem could be solved in the machine vision system by taking two pictures of the component from its two sides from one end of the lead row instead of photographing it from below. Such a solution is applicable in the case of small components that fit completely in the image area of the camera. However, the problems associated with the machine vision system become more pronounced especially in the case of large components that do not fit in the image area of the camera. To achieve a reliable and sufficiently accurate inspection result, it is necessary to use macro optics and a small image area. For instance, a large connector, which may have as many as hundreds of leads arranged in straight rows in two directions perpendicular to each other, will not fit in the image area at once, so that, in order to produce a picture of the entire row of leads, the camera would have to be moved in relation to the component or vice versa during the inspection to produce two or more pictures of the same component. A complicated camera scanning method like this, intended for surface mounted components, is described in specification U.S. Pat. No. 5,805,722.

In the case of large components with long rows of leads, the long row of leads cannot be reliably inspected using a camera even if pictures are taken from the end of the row. The reason for this is the poor depth resolution and parallax error of the required camera optics.

There are also systems in which a picture of the component is taken in motion, but this imposes great demands on the vision software, which therefore becomes heavy and expensive.

A further problem is that taking the component aside from the route between the component feed device and the circuit board in order to take a picture of it significantly retards the assembly process.

The object of the present invention is to eliminate the drawbacks described above.

A specific object of the present invention is to disclose a simple, cheap and reliable inspection procedure and system for inspecting a component to determine its fitness for assembly without substantially retarding the assembly process.

A further object of the invention is to disclose a procedure and system that allow a component fitness inspection to be performed while the component is being transferred to an assembly station, without stopping the transferring motion.

An additional object of the invention is to disclose a procedure and system by which it is possible to reliably inspect the leads of components and ascertain that the leads have not been bent, on all components regardless of the number of leads (e.g. 2–500) and the colour and lead profile of the component.

As for the features characteristic of the invention, reference is made to the claims.

BRIEF DESCRIPTION OF THE INVENTION

In the procedure of the invention, a narrow illuminating beam is directed at a light-sensitive detector; the component is moved in relation to the illuminating beam so that at least one of the leads of the component passes through the illuminating beam and so that the position of the gripper holding the component as a function of time is known; the position data of the gripper is registered; the signal produced by the light-sensitive detector as a result of the illuminating beam being intercepted and shadowed by the lead is registered; and based on the position data of the gripper and the signal produced by the light-sensitive detector position coordinates of a specified lead in relation to the gripper are determined in order to determine the position error, and, if a position error occurs, the position coordinates of said lead of the component are corrected to eliminate said error for making the insertion of the component possible.

The invention has the advantage that it provides a fast and reliable procedure that does not retard the assembly process and is applicable for use with all components with leads regardless of the number of leads. The system is cheap, its production costs are about a tenth of the costs of a machine vision system and it is more reliable than the latter.

Furthermore, the procedure and system allow a component to be inspected while it is being transferred to an assembly station, without stopping the transferring movement.

A further advantage provided by the invention is that an inspection of leads can be performed on all components no matter how many leads (e.g. 2–500) the component has, regardless of component colour and lead profile.

In an embodiment of the procedure the component is moved in relation to the illuminating beam so that all leads of the component pass through the illuminating beam; based on the pulse produced by the light-sensitive detector, the width of the lead row and/or the distance between adjacent leads rows are/is computed; the width of the lead row and/or the distance between adjacent leads rows are/is compared with a specified allowed respective limit value; and the component is placed on the circuit board if the width and/or the distance between adjacent lead rows computed on the basis of the measurement are/is within the allowed limits, or alternatively the component is rejected and removed without placing it on the circuit board if the measured value/values differ from the allowed limit values.

Width of the lead row refers to the width perpendicular to the length of the row. In an ideal case, the row width corresponds to the width of one lead, i.e. when the leads are in a straight line. A lateral divergence of a lead increases the width of the row. The row width can be assigned a limit value that it must not exceed. The invention is based on the insight that measuring the width of the lead row and/or the distance between two adjacent rows is a sufficient expedient for detecting bent leads.

In an embodiment of the procedure, component is taken hold of and moved by means of a gripper of an xyzw-robot.

In an embodiment of the procedure, the lead row of the component is inspected by moving the component in relation to a stationary illuminating beam.

In an embodiment of the procedure, the component is passed cross the illuminating beam in the direction of the width and/or length of the row of the leads.

In an embodiment of the procedure, the signal produced by the light-sensitive detector is a pulse, and the width of the lead row and/or the distance between adjacent lead rows is computed on the basis of the start and end instants of the pulse.

In an embodiment of the procedure, the illuminating beam is directed at the light-sensitive detector in a horizontal plane in the x-direction. For example, in the coordinate system of the assembly robot, x-direction refers to a horizontal direction which is the same as the direction of motion of the circuit board conveyor. In this case, y-direction means a horizontal direction perpendicular to the x-direction. The circuit board lies on a xy-plane. z-direction again means a vertical direction. However, it is to be noted that the invention is not bound to a coordinate system like this, but instead other coordinate systems are possible.

In an embodiment of the procedure, before being moved through an illuminating beam, the component is set to a position where the lead row lies in the x-direction in a horizontal plane, and the component is moved to the y-direction through the illuminating beam.

In an embodiment of the procedure, before being moved through an illuminating beam, the component is set to a position where the lead row lies in a horizontal plane in the y-direction, which is perpendicular to the x-direction, and the component is moved in the y-direction through the illuminating beam.

In an embodiment of the procedure, the component is moved simultaneously in the x and y directions through an illuminating beam.

In an embodiment of the procedure, before being moved through an illuminating beam, the component is set in the z-direction, which is perpendicular to the x and y directions, to a position where the plane of the illuminating beam intersects the leads at a suitable specified distance from their free ends. The illuminating beam intersects the leads more preferably adjacent to the free ends of the leads, and not in the vicinity of the component body to which the leads are fixed.

In one embodiment of the procedure, before being moved through the illuminating beam, the component is rotated (w=rotation about the z-axis).

In one embodiment of the procedure, before being moved through an illuminating beam, the component is slightly rotated about the z-axis so that the lead row which is supposed to be in a straight line becomes in a small angle in relation to the direction of the illuminating beam; the width of the lead row is determined; and based on the determined width of the lead row in relation to the pre-determined lead row width the rotation error of the component in relation to the gripper is determined, and if the rotation error occurs, the position coordinates of said lead of the component are corrected correspondingly to eliminate the effect of the rotation error.

In an embodiment of the procedure, the lead row of the component is inspected by moving the component through a horizontal illuminating beam, which preferably is parallel to the x-direction, first in one direction and then turning the component horizontally through 90° and moving it again through the same illuminating beam.

In an embodiment of the procedure, two parallel illuminating beams placed at a distance from each other, preferably in the x-direction, are provided. The lead row of the component is inspected using a first illuminating beam; the component is turned horizontally through 90°. Then the lead row of the component is inspected using a second illuminating beam.

In an embodiment of the procedure, two illuminating beams perpendicular to each other are provided. The lead row is inspected by moving the component through both illuminating beams.

In an embodiment of the procedure the illuminating beam is generated using a laser. In the scope of the invention, instead of a laser, any other applicable light sources capable of generating a sufficiently narrow light beam can be used.

According to the invention, the system comprises: an inspection device comprising a light source for the generation of an illuminating beam and a light-sensitive detector at which the illuminating beam is directed; means for moving the component in relation to the illuminating beam so that at least one of the leads of the component pass through the illuminating beam and so that the position of the gripper holding the component as a function of time is known; means for registering position data of the gripper; means for registering the signal produced by the light-sensitive detector as a result of the illuminating beam being intercepted and shadowed by the lead; and means arranged to determine, based on the position data of the gripper and the signal produced by the light-sensitive detector, position coordinates of a specified lead in relation to the gripper in order to determine the position error.

In an embodiment of the system, the robot is arranged to move the component cross the illuminating beam so that all leads of the component pass the illuminating beam; and the system comprises: means for computing the width of the lead row and/or the distance between adjacent lead rows on the basis of the pulse; and means for comparing the computed width of the lead row and/or the computed distance between adjacent lead rows with a specified allowed limit value.

In an embodiment of the system, the robot is disposed to move the component in the widthways and/or lengthways direction of the lead row.

In an embodiment of the system, the light source is so disposed that the illuminating beam is horizontal.

In an embodiment of the system, the assembly robot is a xyzw-robot.

In an embodiment of the system, the light source is so disposed that the illuminating beam is parallel to the x-direction in the coordinate system of the robot while the circuit boards lies in the xy-plane.

In an embodiment of the system, the system comprises two adjacent inspection devices, in which the illuminating beams are parallel to each other and at a distance from each other.

In an embodiment of the system, the system comprises two inspection devices, in which the illuminating beams are perpendicular to each other.

In an embodiment of the system, at least one inspection device is disposed between the component feed device and the circuit board conveyor.

In an embodiment of the system, the inspection device/devices is/are so disposed with respect to the circuit board assembly station so that the inspection of leads can be performed during the robot movement transferring the component between the component feed station and the circuit board, substantially without stopping the transferring movement and substantially without diverging from the transfer route between the component feed station and the assembly station.

In an embodiment of the system, the light source is a laser. In the scope of the invention, instead of a laser, any other applicable light sources capable of generating a sufficiently narrow light beam can be used.

In an embodiment of the system the diameter of the illuminating beam is smaller than or equal to the thickness of the lead.

In an embodiment of the system diameter of the illuminating beam is of the order of 0.1 mm.

In the following, the invention will be described in detail by the aid of a few examples of its embodiments with reference to the attached drawings, wherein

BRIEF DESCRIPTION OF THE DRAWINGS

FIG. 8 presents an end view of a connector with several rows of leads, to be inspected using the procedure and system of the invention, FIG. 9 presents the connector in FIG. 8 as seen from the direction IX—IX, FIG. 10 represents the signal produced by the light-sensitive detector during the inspection of the rows 6 of leads of the connector in FIGS. 8 and 9, together with the output signal of the robot's axis of motion.

DETAILED DESCRIPTION OF THE INVENTION

Figure 1:
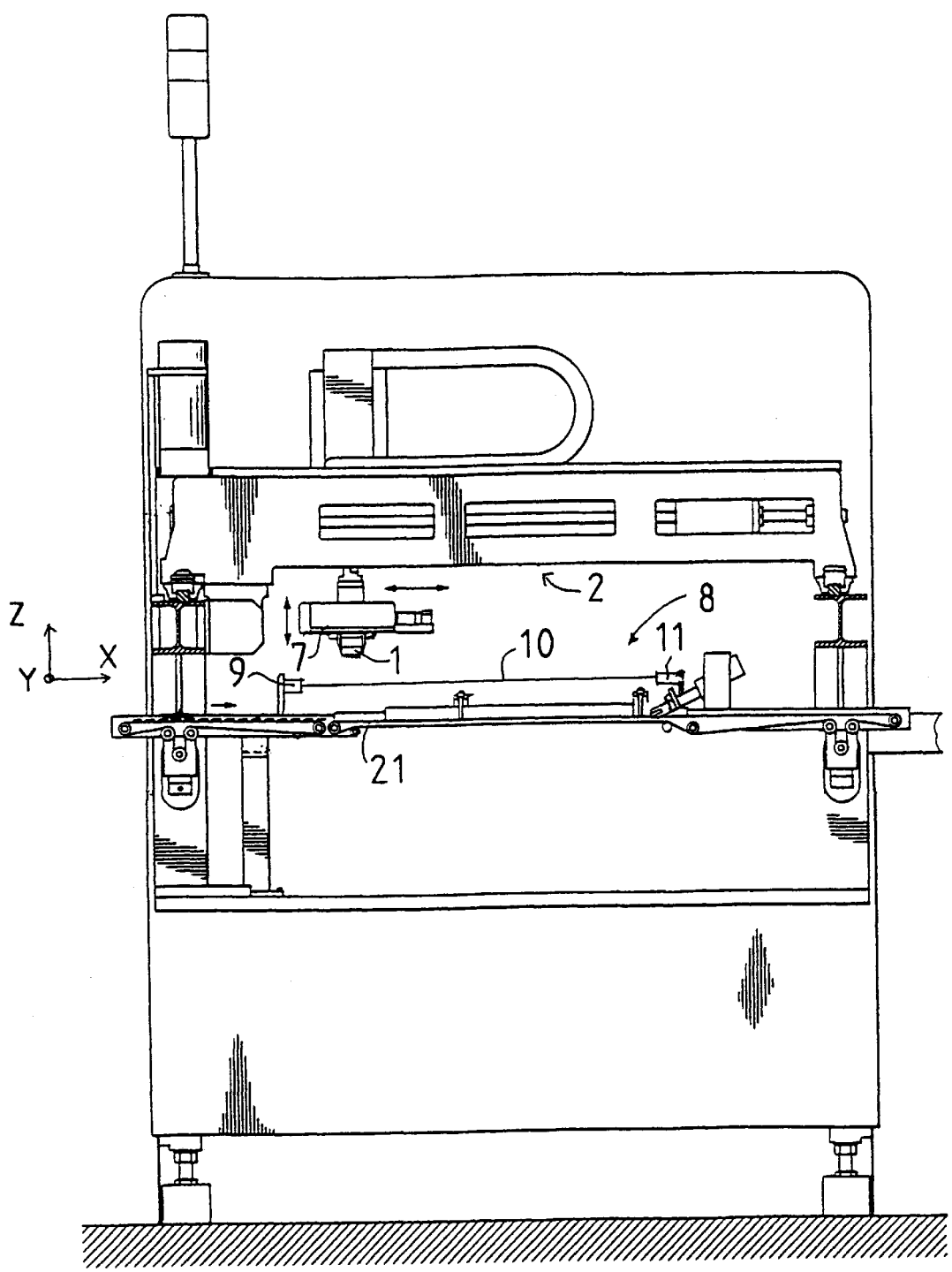
FIG. 1 presents a diagrammatic side view of a laboratory robot cell provided with an embodiment of the inspection system of the invention.
Figure 2:
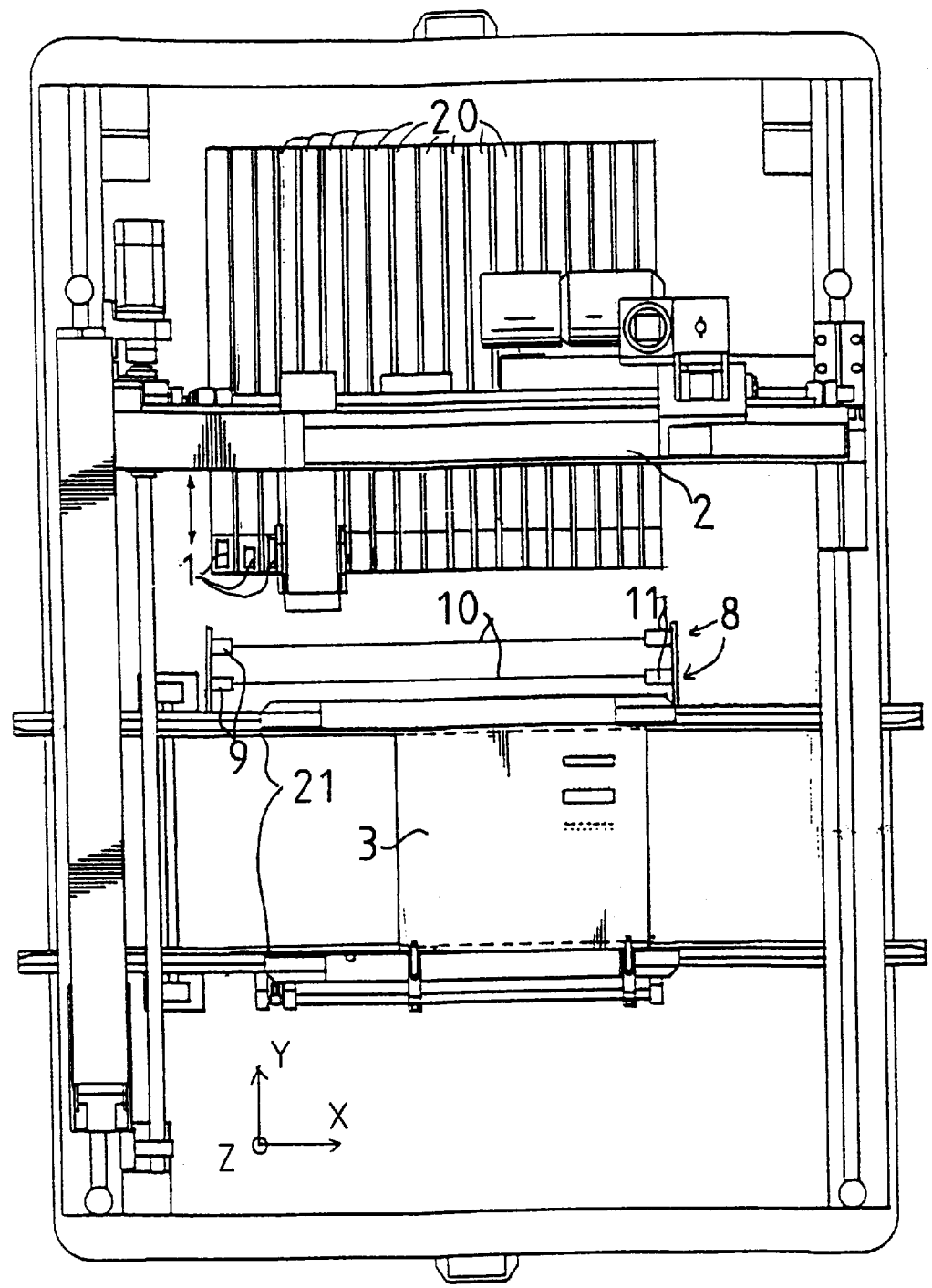
FIG. 2 presents a diagrammatic top view of the laboratory robot cell in FIG. 1.

FIGS. 1 and 2 present an assembly robot cell provided with a system according to the invention for inspecting the components, which automatically optimises the setting coordinates for the component if this is necessary due to a possible inaccuracy in the manner the component is held by the gripper or similar reasons. In addition, at the same time the system automatically inspects the leads of each component before placing it on a circuit board to determine whether the component has any bent or missing leads and whether it can be placed on the circuit board at all or whether it must be rejected and removed.

The assembly robot cell comprises a circuit board conveyor 21, which brings the circuit board 3 to an assembly station, where it is fixed in a predetermined precise position. The circuit board conveyor 21 is located in the working area of an overhead xyzw-portal robot 2 with four degrees of freedom. The coordinate system of the robot has been so defined that the x-direction is a horizontal direction corresponding to the direction of motion of the circuit board conveyor 21. The y-direction is a horizontal direction perpendicular to the x-direction. The z-direction is a vertical direction. The letter "w" in the term "xyzw-robot" refers to the gripper also being rotatable about the z-axis.

The assembly cell is provided with a number of component feed devices 20 located in the working area of the robot, each device feeding a specified component type. The robot can take one component at a time from the component feed device 20 and hold it in its grip. Disposed between the component feed device 20 and the circuit board conveyor 21 are inspection devices 8 according to the invention, the example in FIG. 2 comprising two such devices placed side by side.

The inspection device 8 comprises a laser 9, from which a narrow laser beam 10 is directed in the x-direction at a light-sensitive detector 11 placed at a distance. In this example, the laser beam 10 is stationary. The diameter of the laser beam 10 is disposed to be equal to or slightly smaller than the thickness of the leads 4 to be inspected so that lead 4 is able to break the laser beam 10 and prevent its visibility to the detector 11 when the laser beam hits the lead.

Figure 3:
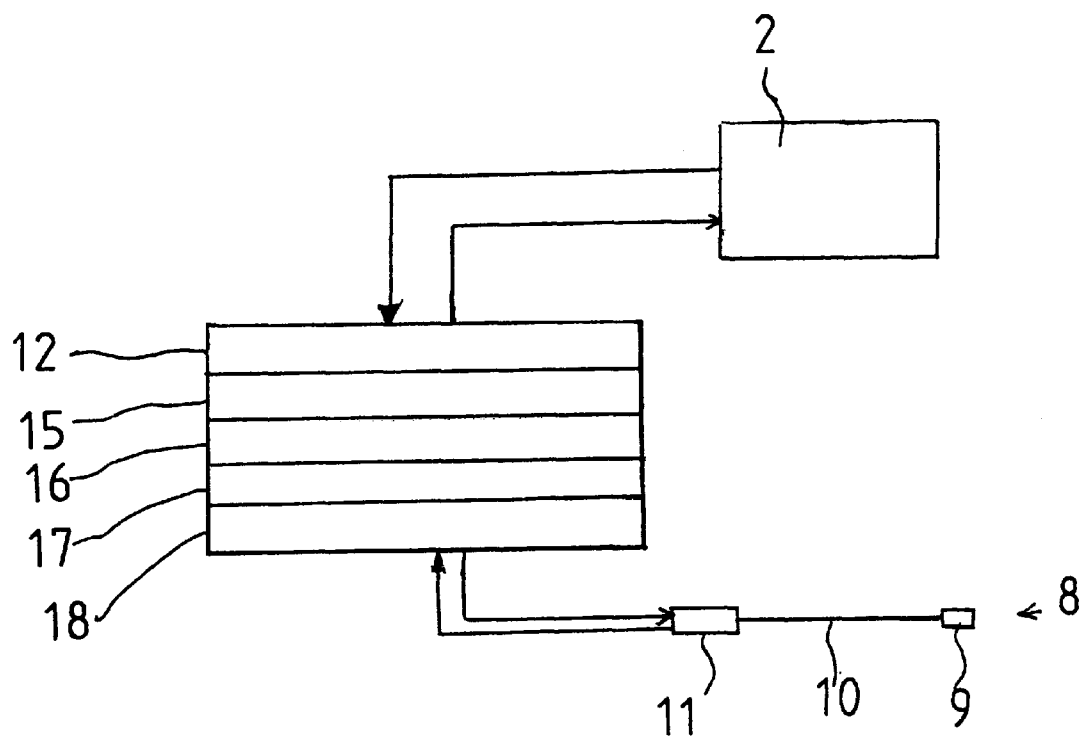
FIG. 3 presents a block diagram representing a principle of a system according to the invention.

FIG. 3 presents the main components of the system as a simplified block diagram. The robot 2 and its control system constitute means by which the component 1 can be moved in relation to the illuminating beam 10 so that the position of the component as a function of time is known, in the widthways and/or lengthways direction of the lead row 5, 6 so that the leads of the component 1 pass through the illuminating beam e.g. as illustrated in FIGS. 4–7. Between two successive lead rows, the illuminating beam 10 reaches the light-sensitive detector 11, and when the laser beam comes to a lead row and falls on a lead, it cannot reach the light-sensitive detector.

Further referring to FIG. 3, the system comprises means 12 for registering position data of the gripper 7 and means 15 for registering the pulse 14 (see FIG. 10) produced by the light-sensitive detector 11 as a result of the illuminating beam using intercepted and shadowed by the lead. The specified lead 4, the accurate position of which is to be determined, can be any lead of the component, e.g. the first lead which crosses the illuminating beam 10 is chosen. As can be seen from FIG. 10, the pulse 14 obtained from the light-sensitive detector 11 consists of on/off states of the detector 11. When the laser beam 10 is intercepted by the lead 4, the detector 11 goes to the 'off' state. When the laser beam again reaches the detector, the detector 11 goes to the 'on' state.

Further the system comprises means 16 which are arranged to determine, based on the position data 13 of the gripper 7 and the pulse 14 produced by the light-sensitive detector 11, position coordinates of said specified lead in relation to the gripper to determine the position error.

If a position error occurs, the position coordinates of said lead of the component are automatically corrected to eliminate said error for making the insertion of the component possible.

Furthermore, the system comprises computing means 17, which compute the width 1 of the lead row and/or the distance e between adjacent lead rows on the basis of the starting and ending instants of the 'on' and 'off' states of the pulse obtained from the light-sensitive detector 11, the speed at which the component was moved by the robot 2 through the laser beam 10 being known. Moreover, the system comprises comparing means 17, which compare the computed width 1 of the lead row and/or the computed distance e between adjacent lead rows to predetermined allowed values. The system instructs the robot to set the component on the circuit board if the width 1 of the lead row and/or the distance e between adjacent lead rows as computed from the measurement are/is within the allowed limit values. If the width 1 of the lead row and/or the distance e between adjacent lead rows as computed from the measurement are/is not within the allowed limit values, then the system will instruct the robot to reject the component 1 and remove it without placing it on the circuit board 3 if the measured value/measured values differ from the allowed limit values.

The computing, calculating and comparing means comprised in the system can be implemented as computer software in a computer controlling the robot. The implementation of one embodiment is described in more detail with reference to FIGS. 15 and 16.

Figure 4:
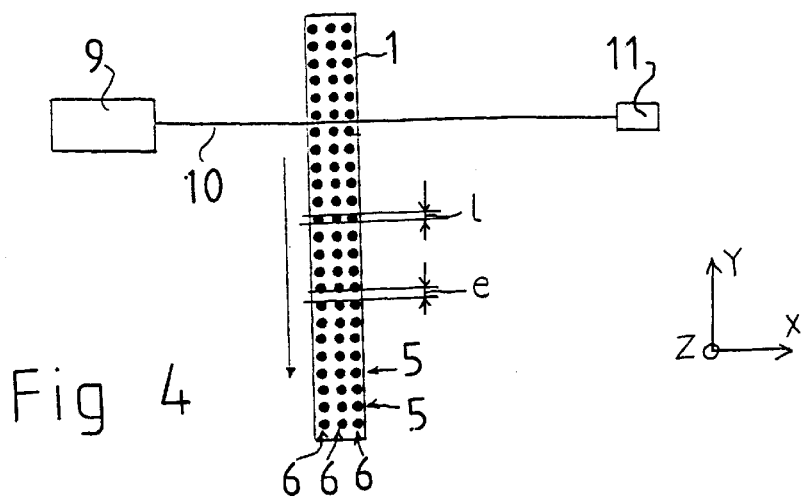
FIGS. 4 and 5 present diagrams illustrating a certain phase of the procedure of the invention.
Figure 5:
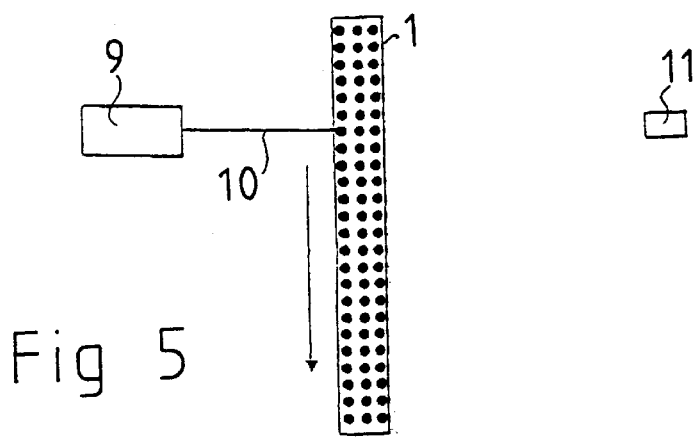
Figure 6:
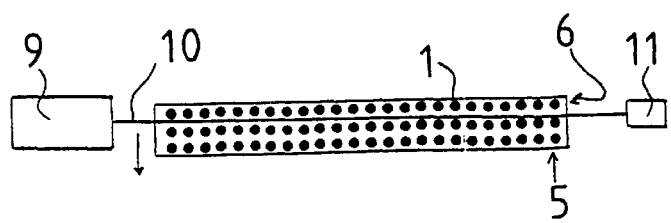
FIGS. 6 and 7 present diagrams illustrating another phase of the procedure of the invention.
Figure 7:
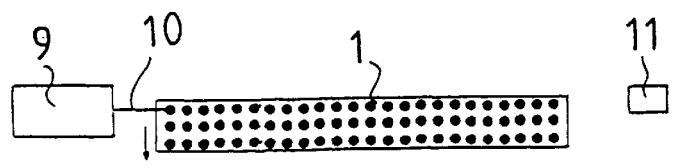

FIG. 4 presents an elongated connector component 1 with a large number of leads 4, shown in the figure as being directed perpendicularly to the image plane. The leads 4 are arranged in three longitudinal rows 6, each comprising 24 leads. The rows 6 are so arranged that the leads are aligned with each other in the transverse direction, thus forming 24 transverse rows 5. For any bends in the leads to be reliably detected, both rows 5 and rows 6 have to be inspected. In the situation illustrated in FIG. 4, the 24 transverse rows 5 are being inspected and the component 1 is being moved through a laser beam 10. Between the rows 5, the laser beam can reach the detector 11, turning it to the 'on' state. In FIG. 5, the laser beam falls on a lead and the light-sensitive detector 11 is in the 'off' state. In FIGS. 6 and 7, the longitudinal rows 6 are being inspected in a corresponding manner.

FIG. 8 shows a magnified end view of the connector 1 in FIGS. 4–7 and FIG. 9 presents the same connector as seen from its lead side. Line T represents the level at which the laser beam passes as the component 1 is being moved in relation to the beam. In the left-hand and middle lead rows 6, some leads protrude to one side, and these are detected because the widths $l_1$ and $l_2$ of the pulses 14 received from the detector 11 exceed the allowed limit values. The pulse for the row 6 on the right has a normal width, which means that the row contains no protruding leads. It is also possible to measure the interspaces $e_1$ and $e_2$ between the leads and compare them to allowed limit values. The square wave in the upper part of FIG. 10 represents the output signal obtained from an encoder connected to the motor of the robot motion shaft, and this signal provides information regarding the position data 13 of the gripper of the robot. By comparing it with the pulse 14, the exact coordinates of a given lead are obtained, from which it is possible to compute the position of the lead and therefore the position of the component in relation to the gripper and correct the position coordinates of the component if this is necessary to ensure successful placement of the component.

Figure 11:
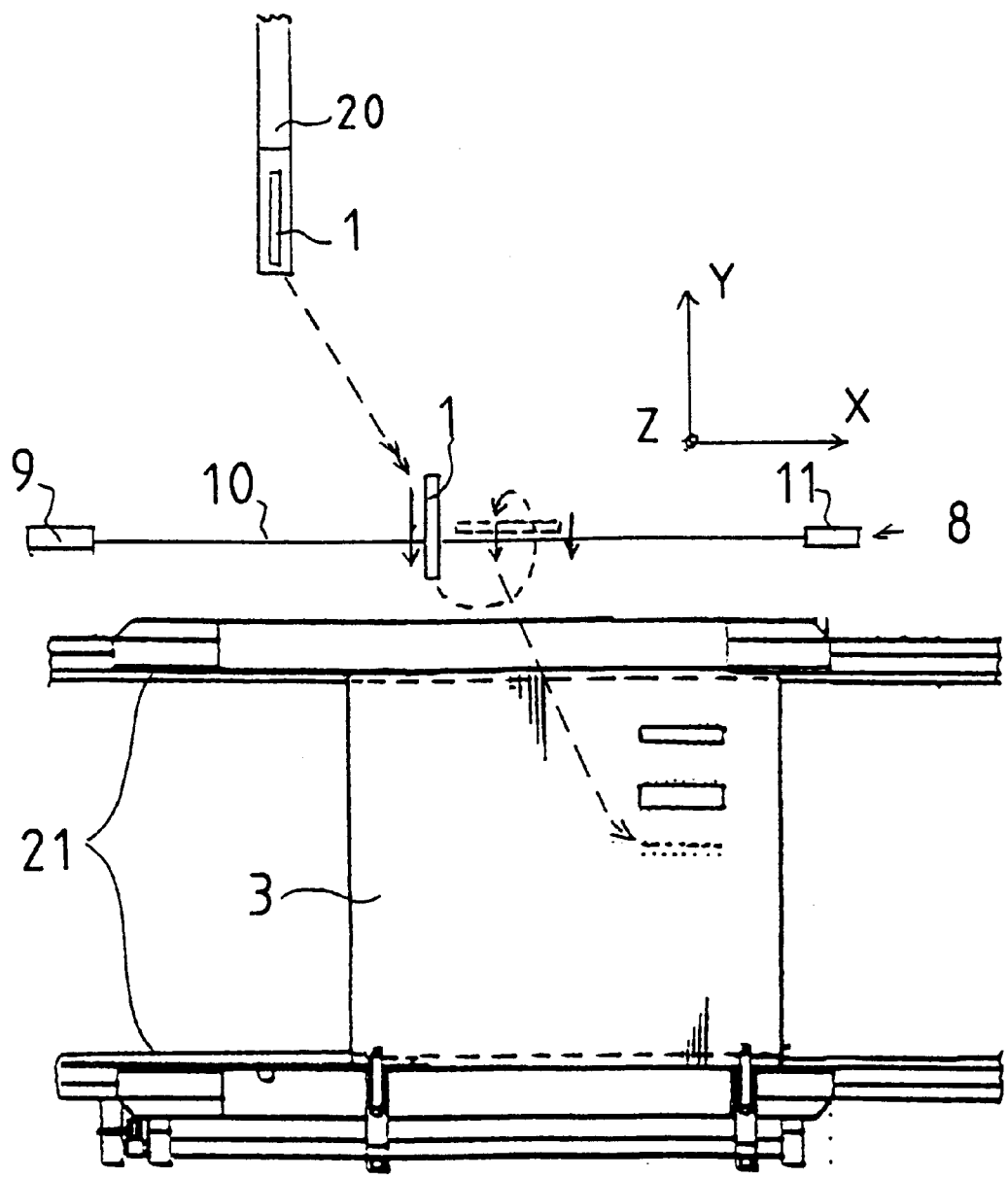
FIGS. 11–14 present diagrammatic views of a first, second, third and fourth embodiments of the procedure and system, illustrating the routes and directions of the transfer of components from the component feed station via the lead inspection stage to the circuit board.

FIG. 11 illustrates an embodiment which uses only one laser beam 10, which is disposed in the x-direction between the component feeder 20 and the circuit board 3 to be assembled, extending across the route along which the component 1 is transferred. For the sake of clarity, the robot is not shown in FIGS. 11–14. The component 1 is taken by the robot first in a lengthways orientation in the y-direction through the laser beam 10, whereupon it is turned by the gripper through 90° in a horizontal plane, moved back and then taken again through the same laser beam 10 in the y-direction. If the component passes the inspection, then it will be placed in its specified location on the circuit board.

Figure 12:
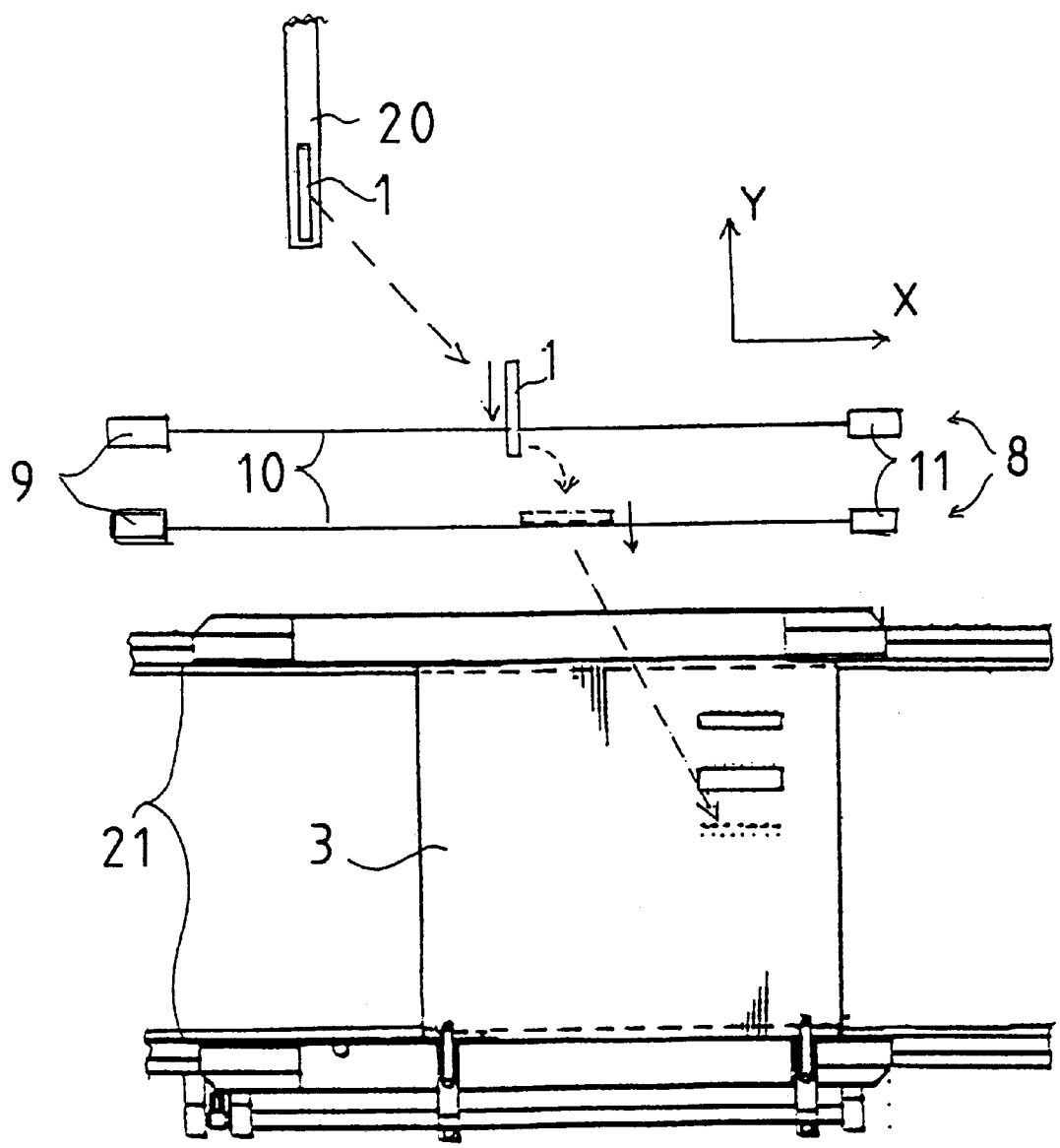

FIG. 12 presents an embodiment corresponding to that in FIG. 2, differing from the embodiment in FIG. 11 in that the embodiment in FIG. 12 comprises two adjacent laser beams 10 disposed in the x-direction on the route of component transfer between the component feeder 20 and the circuit board 3 to be assembled. As this embodiment involves no backward movement, it works faster than the previous embodiment. The component 1 is first taken in a lengthways orientation in the y-direction through a first illuminating beam, then turned horizontally through 90° and taken through a second illuminating beam, still in the y-direction.

Figure 13:
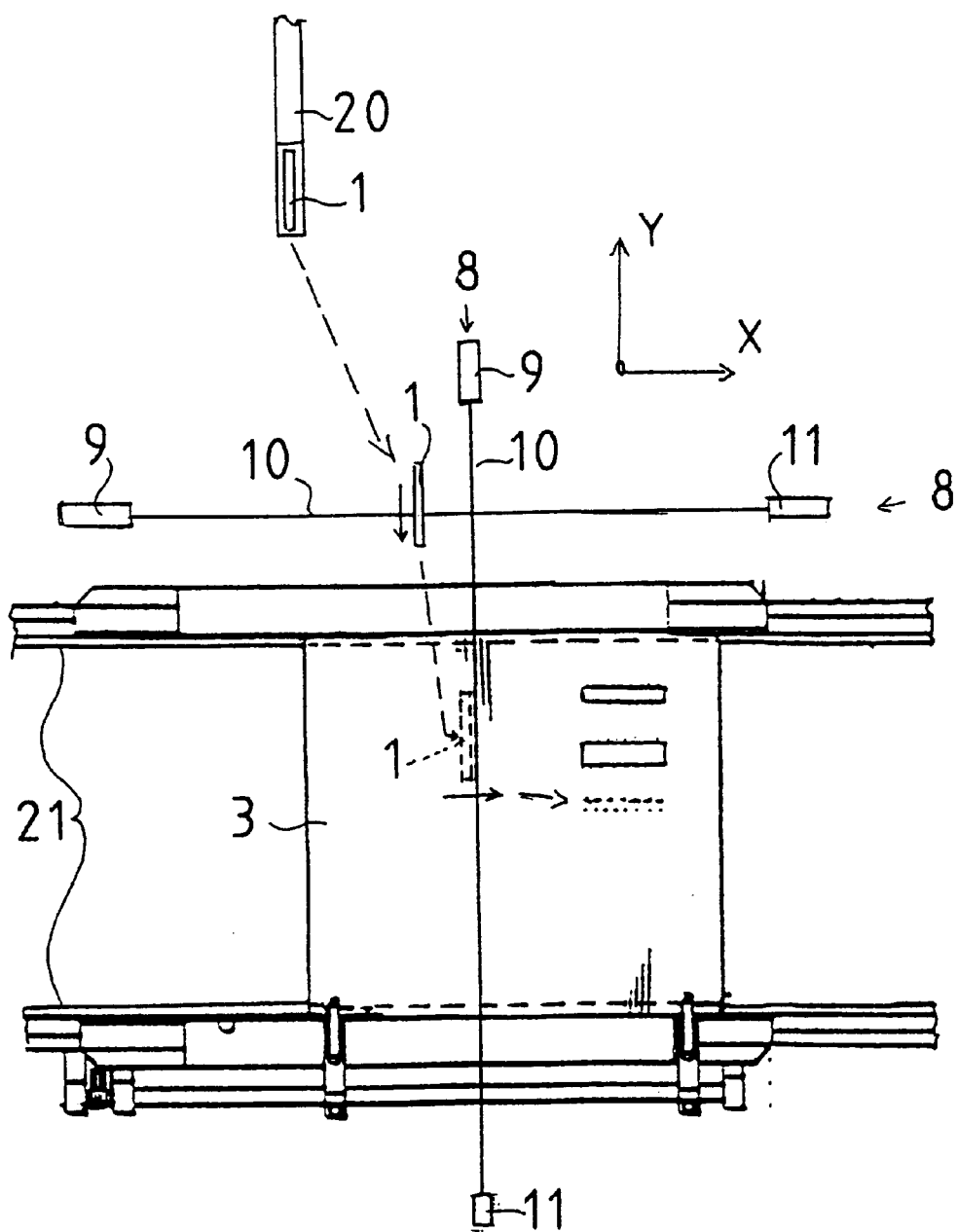

FIG. 13 presents an embodiment which uses two laser beams 10, one of which is oriented in the x-direction and the other in the y-direction, i.e. the beams are perpendicular to each other. The component 1 is moved in the y-direction through the laser beam oriented in the x-direction, and in the x-direction through the laser beam oriented in the y-direction.

Figure 14:
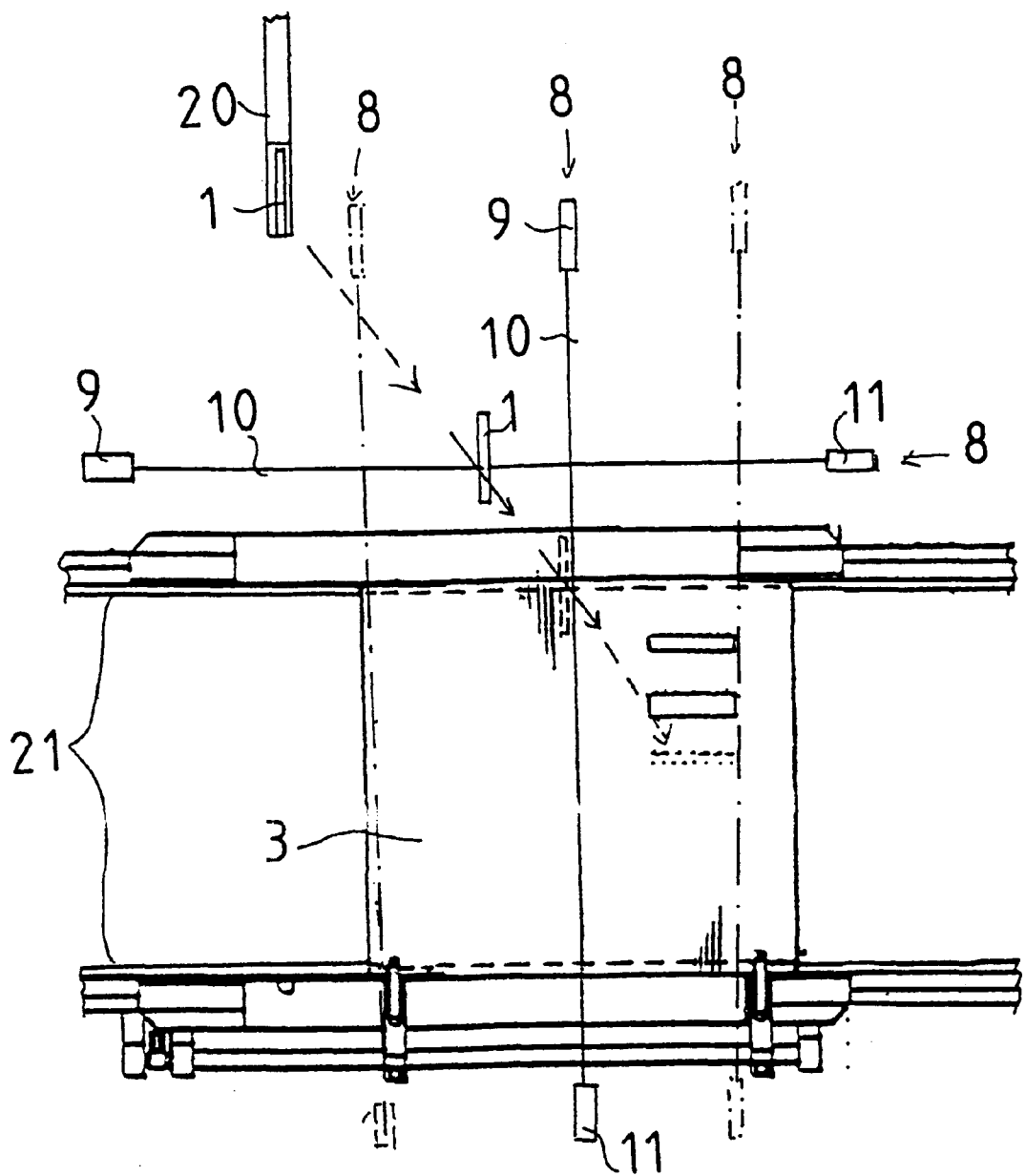

FIG. 14 presents an embodiment which uses two laser beams 10, one of which is oriented in the x-direction and the other in the y-direction, i.e. the beams are perpendicular to each other. The component 1 is moved simultaneously through both laser beams in both the x and y directions, so the direction of motion of the component is at an angle to the illuminating beam. This is the fastest embodiment. In addition, as indicated by broken lines in the figure, the system may comprise several laser beams 10 oriented in the y-direction. These beams can be disposed in suitable locations relative to the circuit board so that the inspection will involve as few turns as possible in the route of the component regardless of where in the circuit board area the component is to be placed.

Figure 15:
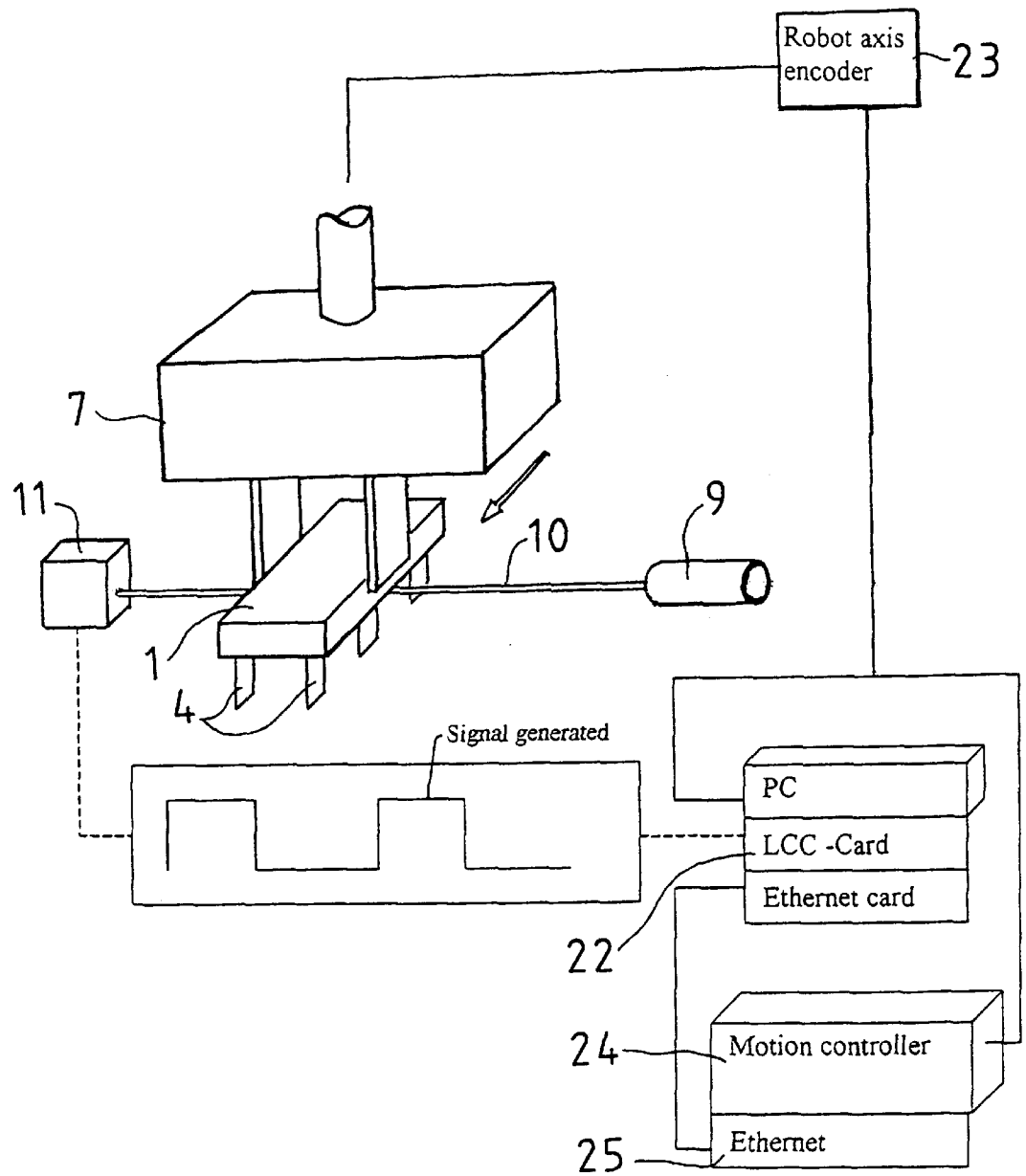
FIG. 15 presents a diagrammatic block diagram of a fifth embodiment of the system.

FIG. 15 presents a system of a further embodiment of the invention. A narrow laser beam 10 is projected horizontally in front of the component feeders 20, as illustrated also in FIG. 2. The system comprises a laser source 9 and a light-sensitive detector 11 which are mounted in opposite sides of the machine frame. When robot picks the component 1 up from the feeder 20 (see FIG. 2) and moves it to the circuit board (PCB board) 3, component leads 4 will cross the laser beam 10. Every time the lead 4 crosses the laser beam, a signal is generated.

The light-sensitive detector 11, later called as laser receiver, is connected to a special PC-card later called as a LLC Card 22 (Laser based Lead Check), which will record the current absolute (or increment) pulse-encoder counts from axis encoders 23 of the xyzw-robot whenever an edge is detected from the signal generated by the laser receiver 11. Based on this information a special PC-software calculates the position of the component leads related to the position of the gripper.

Information is furthermore fed to the motion controller 24 of the xyzw-robot 12 via ethernet link 25 (or via any other media) and motion controller 24 will then automatically correlate the possible position or orientation error before inserting the component onto PCB board.

At the same time the system checks that all leads 4 do exist and that they are in correct positions. In case of fault component, component is rejected and new component will be picked automatically from the feeder.

To accomplish the whole task, system needs some basic information about the structure of the component: lead count, lead width, offset between leads, the number of lead rows, height of the leads. This information will be given from the user interface (not shown) of the assembly robot cell as an expanded information about the feeders.

System can be constructed by using one or several laser beams 10, as illustrated also in FIGS. 2, 12, 13 and 14. If only one laser beam is used, system can check the lead count and position error only from one direction (i.e. y-error). To get both x and y errors, another laser beam is needed. Between first and second laser beams, component is then rotated 90 degrees, as illustrated in FIG. 12.

For rotation error detection, component is slightly rotated so that leads which are supposed to be in line have slight (or if offset between leads in same row is big enough, leads from another line will be seen through offsets from first line) different width then. Based on this width information, rotation error of the component related to the gripper can be calculated.

Figure 16:
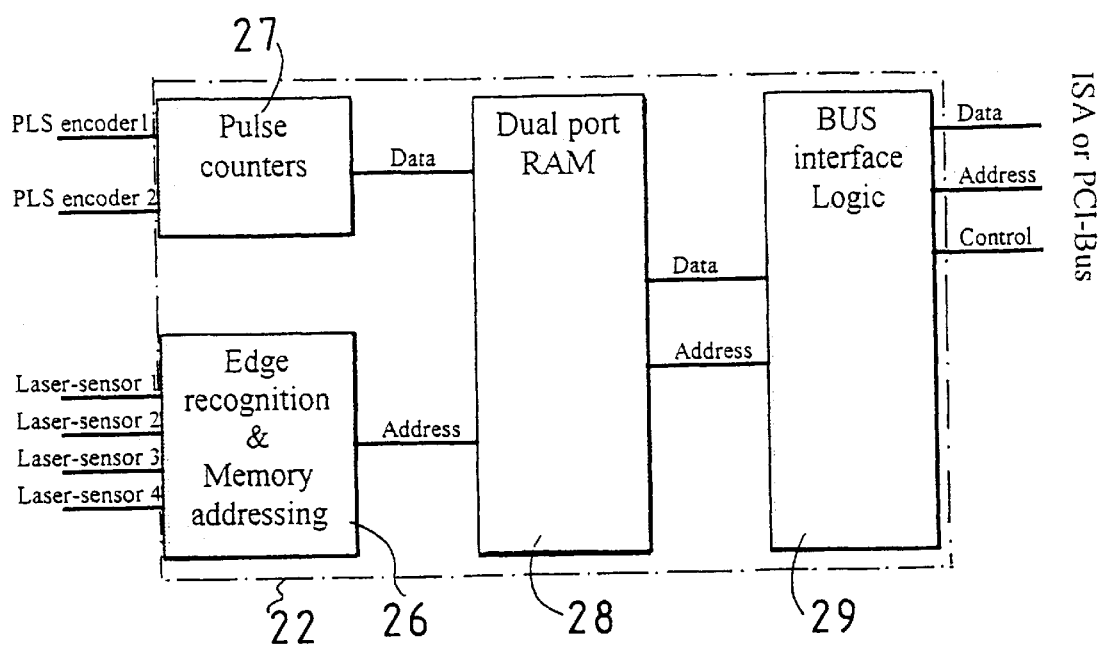
FIG. 16 presents a diagrammatic block diagram of a special PC-card of the system of FIG. 15.

FIG. 16 presents a block diagram of said special PC card 22, called the LLC card, designed for signal handling and calculation in the system of the invention. Major task of the LLC-card is to capture the pulse encoder signal (without losing information) from the axis encoder 23 whenever an edge is detected in an incoming signal at the laser sensor input. LLC-card is equipped with a special circuitry, edge recognition and memory addressing circuitry 26 to detect these edges. Pulse counter circuit 27 are used for counting the pulses coming from axis encoders 23 so that the LLC-card 22 knows the actual position (absolute) of the moving axes. Whenever an edge in the pulse obtained from the detector 11 is detected, a current pulse encoder count is saved onto the dual port RAM memory 28 (which enables the read and write tasks to be made simultaneously) of the LLC-card. If laser sensor input changes, recording will be made into a different address. A bus interface logic 29 enables this information to be transferred from LLC-card into PC's memory. Bus can be any common bus used in PC (ISA, PCI etc).

The invention is not restricted to the examples of its embodiments described above, but many variations are possible within the scope of the inventive idea defined in the claims.

What is claimed is:

1. A method for inspecting a component with leads to determine fitness of the component for assembly in conjunction with automatic circuit board assembly performed using an assembly robot before the component is placed on a circuit board, said component having leads to be inserted into corresponding holes in the circuit board, said robot being equipped with a gripper for taking hold of the component, the method comprising:
   directing a narrow illuminating beam at a light-sensitive detector,
   moving the component, oriented with a row of leads parallel to the illuminating beam, in relation to the illuminating beam so that at least one of the leads of the component passes through the illuminating beam and so that the position of the gripper holding the component as a function of time is known,
   registering position data of the gripper,
   registering a signal produced by the light-sensitive detector as a result of the illuminating beam being intercepted and shadowed by the leads, and
   determining position coordinates of a specified lead in relation to the gripper based on the position data of the gripper and the signal produced by the light-sensitive detector in order to determine a position error, and, if a position error occurs, correcting the position coordinates of said lead of the component to eliminate said error for making insertion of the component possible.

2. A method as defined in claim 1, further comprising moving the component in relation to the illuminating beam so that all leads of the component pass through the illuminating beam,
   computing, based on a pulse produced by the light-sensitive detector, at least one of a width of the lead row and a distance between adjacent leads rows,
   comparing the at least one of the width of the lead row and the distance between adjacent leads rows with a specified allowed respective limit range, placing the component on the circuit board when the at least one of the width and the distance between adjacent lead rows is within the allowed limit range, and rejecting and removing the component without placing the component on the circuit board when the at least one of the width of the lead row and the distance between adjacent leads lies outside the allowed limit range.

3. A method as defined in claim 1, wherein the gripper holding the component is a gripper of an xyzw-robot.

4. A method as defined in claim 1, further comprising passing the component across the illuminating beam in a direction of one of the width and a length of the row of the leads.

5. A method as defined in claim 1, wherein the signal produced by the light-sensitive detector is a pulse, and the at least one of the width of the lead row and the distance between adjacent lead rows is computed on a basis of start and end instants of the pulse.

6. A method as defined in claim 1, further comprising the illuminating beam at the light-sensitive detector in a horizontal plane in an x-direction.

7. A method as defined in claim 1, wherein the assembly robot defines x, y and z directional axes, and further comprising setting the component to a position where the lead row lies in a horizontal plane in an x-direction before moving the component through the illuminating beam, and moving the component in a y-direction through the illuminating beam, the y-direction being orthogonal to the x-direction.

8. A method as defined in claim 1, wherein the assembly robot defines x, y and z directional axes, and further comprising setting the component to a position where the lead row lies in a horizontal plane in a y-direction before moving the component through the illuminating beam, and moving the component in an x-direction through the illuminating beam, the y direction being orthogonal to the x-direction.

9. A method as defined in claim 1, wherein the assembly robot defines x, y and z directional axes and further comprising moving the component is simultaneously in x and y directions through the illuminating beam.

10. A method as defined in claim 1, wherein the assembly robot defines x, y and z directional axes and further comprising adjusting the component in the z-direction, perpendicular to the x and y directions, before moving the component through the illuminating beam, to a position where plane of the illuminating beam intersects the leads adjacent to their free ends.

11. A method as defined in claim 1, further comprising rotating the component before moving the component through the illuminating beam.

12. A method as defined in claim 1, further comprising, before moving the component through the illuminating beam, rotating the component by a small amount about the z-axis so that the lead row rotates from a position parallel to the illuminating beam to define a small angle in relation to the direction of the illuminating beam;

determining the width of the lead row;

determining, based on the determined width of the lead row in relation to the predetermined lead row width, a rotation error of the component in relation to the gripper, and correcting the position coordinates of said lead of the component correspondingly to eliminate the rotation error.

13. A method as defined in claim 1, further comprising inspecting the lead row of the component by moving the component through an illuminating beam oriented parallel to a direction of motion of a circuit board conveyor holding the circuit board, and turning the component horizontally through 90° and moving the component again through the illuminating beam.

14. A method as defined in claim 1, further comprising providing first and second parallel illuminating beams placed at a distance from each other and oriented parallel to a direction of motion of a circuit board conveyor holding the circuit board;

inspecting a first lead row of the component by passing the component through the first illuminating beam;

turning the component horizontally through 90°; and inspecting a second lead row of the component by passing the component through the second illuminating beam.

15. A method as defined in claim 1, further comprising providing two mutually perpendicular illuminating beams; and inspecting the lead row by moving the component through the two mutually perpendicular illuminating beams.

16. A method as defined in claim 1, further comprising generating the illuminating beam using a laser.

17. A system for inspecting a component with leads to determine fitness of the component for assembly in conjunction with automatic circuit board assembly performed using an assembly robot before the component is placed on a circuit board, said component having at least two leads to be inserted into corresponding holes in the circuit board, said robot being equipped with a gripper for taking hold of the component, the system comprising:

a first inspection device including a first light source to generate a first illuminating beam and a first light-sensitive detector at which the first illuminating beam is directed, means for moving the component in relation to the illuminating beam so that at least one of the leads of the component pass through the illuminating beam and so that the position of the gripper holding the component as a function of time is known, means for registering position data of the gripper, means for registering the signal produced by the light-sensitive detector as a result of the illuminating beam being intercepted by the lead, and means for determining, based on the position data of the gripper and the signal produced by the light-sensitive detector, position coordinates of a specified lead in relation to the gripper in order to determine a position error.

18. A system as defined in claim 17, wherein the robot is arranged to move the component across the first illuminating beam so that all leads of the component pass through the first illuminating beam; and the system further comprises means for computing at least one of a lead row width and a distance between adjacent lead rows, and means for comparing the at least one of the lead row width and the distance between adjacent lead rows with a specified allowed limit value.

19. A system as defined in claim 17, wherein the robot is disposed to move the component in at least one of a direction parallel to and perpendicular to the lead row.

20. A system as defined in claim 17, wherein the first light source is disposed so that the first illuminating beam is horizontal.

21. A system as defined in claim 17, is a xyzw-robot.

22. A system as defined in claim 17, wherein the first light source is disposed so that the first illuminating beam is parallel to an x-axis lying parallel to a direction of motion of a conveyor holding the circuit board, the circuit board lies in an xy-plane defined by the x-axis and a horizontal y-axis orthogonal to the x-axis.

23. A system as defined in claim 17, further comprising a second inspection device producing a second illumination beam parallel to the first illuminating beam and spaced apart from the first illuminating beam.

24. A system as defined in claim 17, further comprising a second inspection device producing a second illuminating beam perpendicular to the first illuminating beam.

25. A system as defined in claim 17, wherein the first inspection device is disposed between a component feed device and a circuit board conveyor holding the circuit board.

26. A system as defined in claim 26, wherein the first inspection device is disposed on a component transfer route between the component feed station and the circuit board, so that inspection of the leads is performed as the robot transfers the component between the component feed station and the circuit board, substantially without stopping and substantially without diverging from the component transfer route between the component feed station and the circuit board.

27. A system as defined in claim 17, wherein the first light source is a laser.

28. A system as defined in claim 17, wherein a width of the first illuminating beam is no more than a lead thickness.

29. A system as defined in claim 17, wherein a width of the first illuminating beam is of around 0.1 mm.

30. A system for inspecting a component with leads to determine fitness of the component for assembly in conjunction with automatic circuit board assembly performed using an assembly robot before the component is placed on a circuit board, said component having at least two leads to be inserted into corresponding holes in the circuit board, the system comprising:

a first inspection device including a first photodetector and first light source generating a first illuminating beam directed at the first photodetector;

a gripper arranged to hold the component with a row of component leads being parallel the illuminating beam and to move the component relative to the first illuminating beam so that at least one of the component leads passes through the illuminating beam;

a controller coupled to the gripper to track a gripper position as a function of time, and coupled to receive a detection signal from the first photodetector, and to determine a position of the at least one of the component leads.

31. A system as defined in claim 30, wherein the photodetector detects an optical signal related to at least one of a width of a component lead row and a separation distance between adjacent component lead rows, and the controller determines the least one of a width of a component lead row and a separation distance between adjacent component lead rows from the detection signal received from the photodetector.

* * * * *